(12) United States Patent
Choi et al.

(10) Patent No.: US 8,780,019 B2
(45) Date of Patent: Jul. 15, 2014

(54) ELECTROLUMINESCENCE DISPLAY PANEL AND DRIVING METHOD THEREOF

(75) Inventors: Hyungsuk Choi, Beijing (CN); Jai-il Ryu, Beijing (CN); Wonseok Kim, Beijing (CN); Seongyeol Yoo, Beijing (CN); Dohyeong Kim, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 1372 days.

(21) Appl. No.: 12/127,239

(22) Filed: May 27, 2008

(65) Prior Publication Data

US 2009/0079351 A1  Mar. 26, 2009

(30) Foreign Application Priority Data

Sep. 21, 2007  (CN) .......................... 2007 1 0122169

(51) Int. Cl.
G09G 3/30 (2006.01)

(52) U.S. Cl.
USPC ............................................. 345/77; 345/76

(58) Field of Classification Search
USPC ................... 345/76–83, 204–215, 690–699; 315/169.1–169.4
See application file for complete search history.

(56) References Cited

U.S. PATENT DOCUMENTS

| | | | |
|---|---|---|---|
| 6,366,025 B1 | 4/2002 | Yamada | |
| 7,515,122 B2* | 4/2009 | Miller et al. | 345/76 |
| 7,542,019 B2* | 6/2009 | Park et al. | 345/82 |
| 7,545,352 B2* | 6/2009 | Kwak et al. | 345/82 |
| 7,679,587 B2* | 3/2010 | Kwak | 345/82 |
| 7,773,056 B2* | 8/2010 | Kwak et al. | 345/76 |
| 8,111,224 B2* | 2/2012 | Park et al. | 345/83 |
| 8,338,832 B2* | 12/2012 | Kim | 257/72 |
| 8,441,420 B2* | 5/2013 | Kim et al. | 345/82 |
| 2002/0070909 A1* | 6/2002 | Asano et al. | 345/76 |
| 2003/0128179 A1 | 7/2003 | Credelle | |
| 2004/0130559 A1* | 7/2004 | Lee et al. | 345/690 |
| 2004/0222746 A1* | 11/2004 | Winters | 315/167 |
| 2005/0231534 A1* | 10/2005 | Lee | 345/690 |

(Continued)

FOREIGN PATENT DOCUMENTS

| | | |
|---|---|---|
| CN | 1998041 | 7/2007 |
| KR | 10-0709227 | 4/2007 |
| KR | 709227 B1 * | 4/2007 |
| WO | WO 2005/101513 A1 | 10/2005 |

OTHER PUBLICATIONS

Chinese Examination Report issued on Oct. 18, 2011 in Chinese application No. 200710122169.4 and Applicant-provided English translation.

*Primary Examiner* — Alexander Eisen
*Assistant Examiner* — Patrick F Marinelli
(74) *Attorney, Agent, or Firm* — Ladas & Parry, LLP

(57) ABSTRACT

The present invention relates to an electroluminescence display panel and a method of driving the same. The electroluminescence display panel comprises a plurality of pixels arranged in a matrix, each of the pixels including a red sub-pixel, a green sub-pixel and a blue sub-pixel. The blue sub-pixel includes at least a first blue sub-sub-pixel and a second blue sub-sub-pixel. In operation, the first blue sub-sub-pixel and the second blue sub-sub-pixel are alternately driven among frames.

6 Claims, 2 Drawing Sheets

(56) References Cited

U.S. PATENT DOCUMENTS

| | | | |
|---|---|---|---|
| 2006/0044245 A1* | 3/2006 | Park et al. ................... | 345/92 |
| 2006/0125807 A1* | 6/2006 | Park et al. ................... | 345/204 |
| 2006/0186822 A1* | 8/2006 | Park ............................ | 315/169.3 |
| 2007/0108443 A1* | 5/2007 | Kim ............................ | 257/40 |
| 2007/0222800 A1* | 9/2007 | Fish et al. .................. | 345/694 |
| 2007/0279343 A1* | 12/2007 | Kim ............................ | 345/77 |
| 2009/0128458 A1* | 5/2009 | Kim et al. ................... | 345/76 |
| 2011/0074838 A1* | 3/2011 | Yamamoto et al. ........ | 345/690 |

* cited by examiner

ELECTROLUMINESCENCE DISPLAY PANEL AND DRIVING METHOD THEREOF

BACKGROUND

The present invention relates to an electroluminescence display device.

As a new type of display device, electroluminescence (EL) display device displays by using light generated through electrically exciting organic compounds. The EL display device has advantages of low power consumption, flat plate display, self-illuminating, etc. However, due to insufficient performance and being heated intrinsically in operation, the organic compounds developed currently have a short lifetime. Typically, red and green organic compounds for emitting red and green color light respectively have a lifetime more than about 40,000 hours, and blue organic compound for emitting blue color light has a shorter lifetime of about 10,000-15,000 hours, which is about ⅓ of that of the red and green organic compounds, since the blue organic compound is heated more quickly.

As described above, since the red, green and blue organic compounds constituting an EL display device have different lifetimes, and in particular, the lifetime of the blue organic compound is about ⅓ of that of the red and green organic compounds, the blue organic compound render decreased the lifetime of the whole EL display panel using such three kinds of organic compounds.

Two technical solutions to extend the lifetime of blue sub-pixels have been proposed in a conventional technology. One is to apply a low electrical current to a blue sub-pixel, and the other is to enlarge area of the blue sub-pixel while applying a low electrical current thereto. Although the first method of applying a low electrical current may extend the lifetime of blue sub-pixels, color reproduction under a low current is weaker than that under a normal electrical current, and thus color requirement for full color display can not be satisfied properly. The second method satisfies a general color requirement by enlarging the area, but the color reproduction is still weaker than that that under a normal electrical current and the color requirement for full color display cannot be satisfied either.

SUMMARY

An exemplary embodiment of the invention provides an electroluminescence display panel comprising a plurality of pixels s arranged in a matrix. Each of the pixels comprises a red sub-pixel, a green sub-pixel and a blue sub-pixel. The blue sub-pixel includes at least a first blue sub-sub-pixel and a second blue sub-sub-pixel. In operation, the first and second blue sub-sub-pixels are used alternately among frames, so as to emit light of a predetermined color.

Another exemplary embodiment of the invention provides a method of driving an electroluminescence (EL) display panel comprising a plurality of pixels arranged in a matrix, each of the pixels including a red sub-pixel, a green sub-pixel and a blue sub-pixel, and the blue sub-pixel including at least a first blue sub-sub-pixel and a second blue sub-sub-pixel, the method comprising in operation, the first and second blue sub-sub-pixels are driven alternately among frames to emit light of a predetermined color.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

In consideration of technical problem that an electroluminescence (EL) display panel has a short lifetime directly due to a short lifetime of blue sub-pixels, an embodiment of the invention propose a EL display panel in which at least two blue sub-sub-pixels are operated alternately, that is, a blue sub-pixel is constituted of at least two blue sub-sub-pixels used alternately in operation such that the blue sub-pixel as a whole has an extended lifetime, thereby extending the lifetime of the EL display panel.

First Embodiment

Figure 1A:
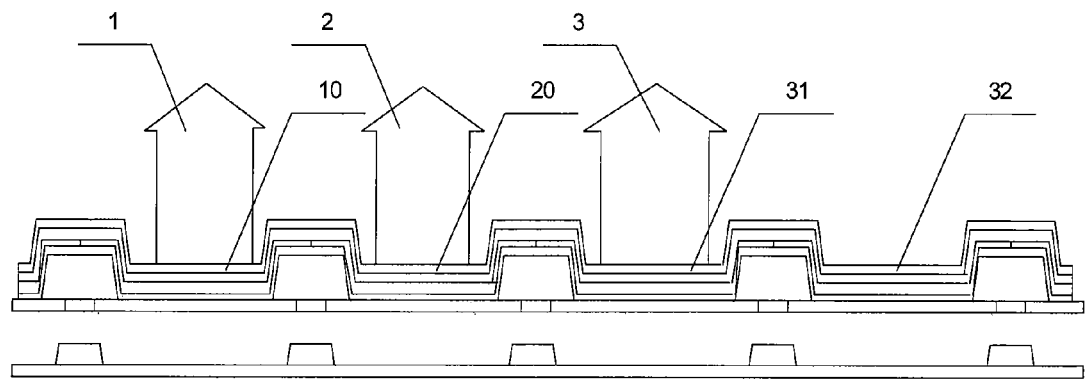
FIGS. 1a and 1b are schematic illustrations showing a configuration of an electroluminescence display panel according to a first embodiment of the invention.
Figure 1B:
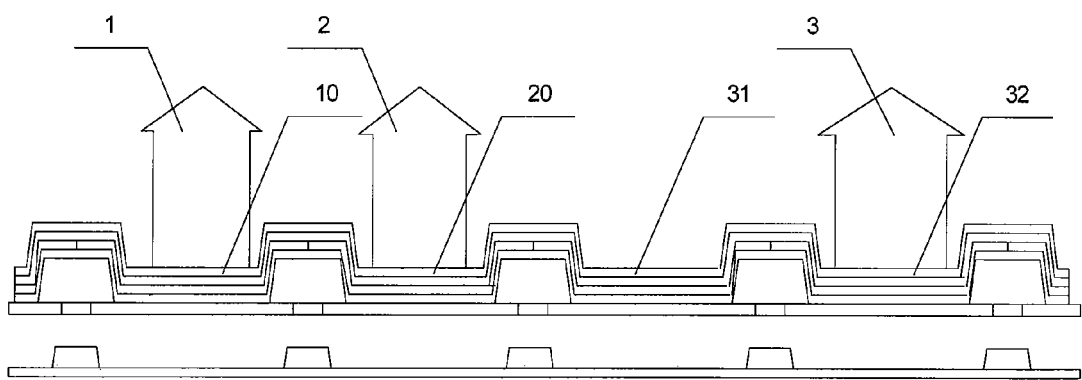

FIGS. 1a and 1b are schematic illustrations showing a configuration of an EL display panel according to a first embodiment of the invention. As shown in FIGS. 1a and 1b, the EL display panel of the present embodiment comprises a plurality of pixels arranged in a matrix, each of which comprises a red sub-pixel 10, a green sub-pixel 20, a first blue sub-sub-pixel 31 and a second blue sub-sub-pixel 32. The first and second blue sub-sub-pixels 31 and 32 constitute a blue sub-pixel, and each of them has a respective driving electrode. In operation, the first and second blue sub-sub-pixels 31 and 32 are driven alternately among frames, that is, one of them is driven in each frame. As shown in FIG. 1a, at a first timing, a voltage is applied through a corresponding electrode on the panel to the red sub-pixel 10 so as to control the red sub-pixel 10 to emit red color light 1; a voltage is applied through a corresponding electrode to the green sub-pixel 20 so as to control the green sub-pixel 20 to emit green color light 2; and a voltage is applied through a corresponding electrode to the first blue sub-sub-pixel 31 so as to control the first blue sub-sub-pixel 31 to emit blue color light 3. The red color light 1, the green color light 2, and the blue color light 3 are used as three primary colors for full color display. As shown in FIG. 1b, at a second timing, a voltage is applied through a corresponding electrode to the red sub-pixel 10 so as to control the red sub-pixel 10 to emit red color light 1; a voltage is applied through a corresponding electrode to the green sub-pixel 20 so as to control the green sub-pixel 20 to emit green color light 2; and a voltage is applied through a corresponding electrode to the second blue sub-sub-pixel 32 so as to control the second blue sub-sub-pixel 32 to emit blue color light 3. The red color light 1, the green color light 2, and the blue color light 3 are also used as three primary colors for full color display. The procedure is repeated to display images. Thus, the first and second blue sub-sub-pixels 31 and 32 constituting a blue sub-pixel are driven alternately in operation, and the lifetime of the blue sub-pixel is extended at least two times longer than that of a blue sub-pixel in a conventional EL display panel.

In the pixel configuration design according to the present embodiment of the invention, the green sub-pixel having a higher visibility (degree of being distinguished by human eyes) is designed preferably to have a smaller area, and area of the red sub-pixel and area of the blue sub-sub-pixels are increased slightly such that area ratio of the green sub-pixel, the red sub-pixel, and the first (or second) blue sub-sub-pixel is about 100:110:120. More preferably, the area of the first blue sub-sub-pixel is equal to that of the second blue sub-sub-pixel, and in this case, the display quality can be highly improved.

Second Embodiment

Figure 2:
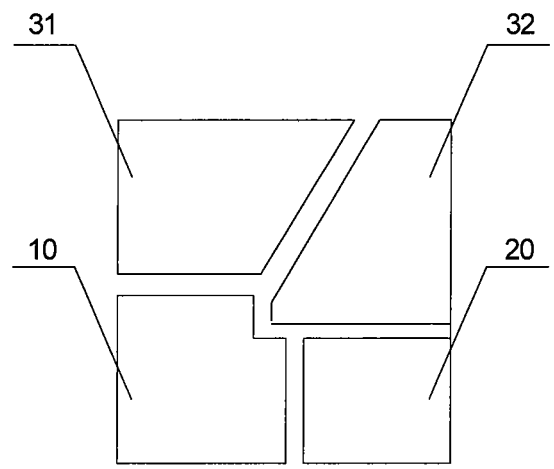
FIG. 2 is a schematic illustration showing a configuration of an electroluminescence display panel according to a second embodiment of the invention.

FIG. 2 is a schematic illustration showing a configuration of an EL display panel according to a second embodiment of the invention. In the foregoing embodiment as shown in FIGS. 1a and 1b, the pixel configuration is a typical stripe design, in which the red sub-pixel 10, green sub-pixel 20, first blue sub-sub-pixel 31 and second blue sub-sub-pixel 32 are arranged in this order side by side in a stripe form. In this case, since the second blue sub-sub-pixel 32 is farther away from the red sub-pixel 10 and the green sub-pixel 20, the color reproduction when the first blue sub-sub-pixel 31 is operated and the color reproduction when the second blue sub-sub-pixel 32 is operated are not identical to each other, and thus image resolution may be lowered.

To solve the problem of image resolution decrease in a stripe configuration, an embodiment of the invention further proposes a block pixel configuration. As shown in FIG. 2, the first blue sub-sub-pixel 31 is adjacent to the red sub-pixel 10, the second blue sub-sub-pixel 32 is adjacent to the green sub-pixel 20, and the first blue sub-sub-pixel 31 is adjacent to the second blue sub-sub-pixel 32. The positional relationship of the first blue sub-sub-pixel 31 with respect to the red sub-pixel 10 and the green sub-pixel 20 is substantially equivalent to that of the second blue sub-sub-pixel 32. The pixel configuration according to the present embodiment gives rise to symmetrical area, symmetrical location, symmetrical display, etc. Thus, the image resolution is greatly increased while obtaining a long lifetime.

In the pixel configuration design according to the present embodiment of the invention, the green sub-pixel having a higher visibility is designed preferably to have a smaller area, and area of the red sub-pixel and area of the blue sub-sub-pixels are increased slightly such that area ratio of the green sub-pixel, the red sub-pixel, and the first (or second) blue sub-sub-pixel is about 100:110:120. More preferably, the area of the first blue sub-sub-pixel is equal to that of the second blue sub-sub-pixel, and in this case, the display quality can be highly improved.

Third Embodiment

Figure 3:
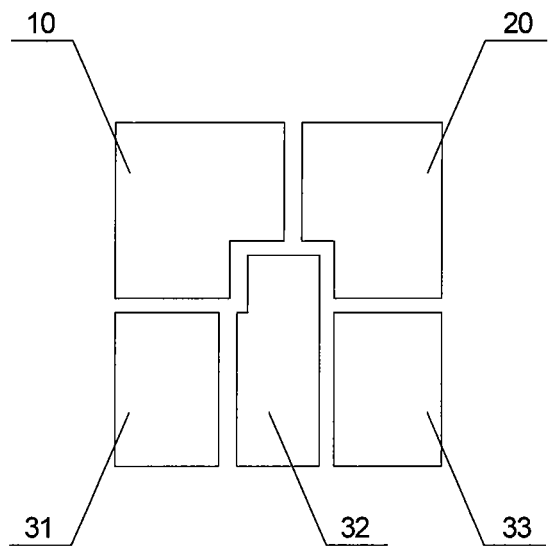
FIG. 3 is a schematic illustration showing a configuration of an electroluminescence display panel according to a third embodiment of the invention.

FIG. 3 is a schematic illustration showing a configuration of an EL display panel according to a third embodiment of the invention. As shown in FIG. 3, the EL display panel of the present embodiment comprises a plurality of pixels arranged in a matrix, each of which comprises a red sub-pixel 10, a green sub-pixel 20, a first blue sub-sub-pixel 31, a second blue sub-sub-pixel 32, and a third blue sub-sub-pixel 33. The first, second, and third blue sub-sub-pixels 31, 32, and 33 together constitute a blue sub-pixel, and each of them has a respective driving electrode. In operation, the first, second and third blue sub-sub-pixels 31, 32 and 33 are driven alternately among frames. Specifically, one or two of them are driven in each frame, and preferably two of them are driven simultaneously in each frame.

For example, at a first timing, voltages are applied to the red sub-pixel 10, the green sub-pixel 20, the first blue sub-sub-pixel 31, and the second blue sub-sub-pixel 32 through corresponding electrodes on the panel, respectively, obtaining three primary colors for full color display. At a second timing, voltages are applied to the red sub-pixel 10, the green sub-pixel 20, the second blue sub-sub-pixel 32, and the third blue sub-sub-pixel 33 through corresponding electrodes on the panel, respectively, obtaining three primary colors for full color display. At a third timing, voltages are applied to the red sub-pixel 10, the green sub-pixel 20, the third blue sub-sub-pixel 33, and the first blue sub-sub-pixel 31 through corresponding electrodes on the panel, respectively, obtaining three primary colors for full color display. The procedure is repeated to display images. In this way, two of the first blue sub-sub-pixel 31, the second blue sub-sub-pixel 32, and the third blue sub-sub-pixel 33 are driven by turns, and thus the lifetime of the blue sub-pixel is extended at least 1.5 times longer than that of a blue sub-pixel of a conventional EL display panel. If the blue sub-sub pixels are driven with a low electrical current, the lifetime can be further extended substantially without lowering the display quality, because two blue sub-sub pixels can be used to emit more light.

Alternatively, in operation, one of the first, second and third blue sub-sub-pixels 31, 32 and 33 is driven alternately together with one of the rest two. For example, at a first timing, the second blue sub-sub-pixel 32 is driven together with the first blue sub-sub-pixel 31, and at a second timing, the second blue sub-sub-pixel 32 is driven together with the third blue sub-sub-pixel 33. In this exemplary configuration, for example, the common second blue sub-sub-pixel 32 can be driven with a low driven current so as to obtain a longer lifetime.

The present embodiment is also of a block pixel configuration, in which the first blue sub-sub-pixel 31 is adjacent to the red sub-pixel 10, the third blue sub-sub-pixel 33 is adjacent to the green sub-pixel 20, and the second blue sub-sub-pixel 32 is adjacent to both the red sub-pixel 10 and the green sub-pixel 20. In the pixel configuration according to the present embodiment, three blue sub-sub-pixels have characteristics of symmetrical area, symmetrical location, symmetrical display, etc. Thus, the image resolution can be greatly increased while obtaining a long lifetime.

In the pixel configuration design according to present embodiment of the invention, the green sub-pixel having a higher visibility is designed preferably to have a smaller area, and area of the red sub-pixel and area of the blue sub-sub-pixels are increased slightly such that ratio of area of the green sub-pixel, area of the red sub-pixel and a sum of areas of the first and second blue sub-sub-pixels (or a sum of areas of the second and third blue sub-sub-pixels, or a sum of areas of the third and first blue sub-sub-pixels) is about 100:110:120. More preferably, areas of the first, second and third blue sub-sub-pixels are equal to each other, and in this case, the display quality can be highly improved.

In above embodiments of the invention, it is not necessary that respective sub-pixels, sub-sub-pixels are strictly aligned symmetrically with each other. Even though the sub-pixels and sub-sub-pixels are unsymmetrical in a microscopic view, it is only a small dot in a macroscopic view, and will not obviously disadvantageously affect the visibility. Many variations may be made to pixel configurations as shown in FIGS. 2 and 3, details of which would not be described herein for simplicity.

In FIGS. 1a and 1b, each pixel comprises a stack of anode electrode, organic semiconductor layer, and cathode electrode. Holes and electrons are injected into the organic semiconductor layer via the anode and cathode electrodes, respectively. The injected holes and electrons recombine in the organic semiconductor layer to emit light. Further, except for a light emitting layer for emitting light, the organic semiconductor may further comprise additional assistant layers such as a hole injection layer, a hole transport layer, an electron injection layer, an electron transport layer or the like to constitute a laminated structure.

In consideration of the technical problem that the EL display panel has a short lifetime due to a short lifetime of blue organic compound in blue sub-pixels, embodiments of the invention propose an EL display panel in which at least two blue sub-sub-pixels are included. In the invention, lifetime of blue sub-pixels is extended by alternately driving at least two blue sub-sub-pixel among frames. Further, by use of block pixel configuration, blue sub-sub-pixels each have substantially an equivalent positional relationship with respect to red and green sub-pixels, and have characteristics of symmetrical area, symmetrical location, symmetrical display, etc. Thus, the image resolution can be greatly increased while obtaining a longer lifetime. An embodiment of the invention provides a method to driven the above EL display panel.

The invention is not limited to the configuration of the above-described embodiments. For example, the each pixel may further a white sub-pixel in addition to the red, green, blue sub-pixels so as to emit light of a predetermined color in combination.

The embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. An electroluminescence (EL) display panel comprising:
a plurality of pixels arranged in a matrix, each of the pixels including a red sub-pixel, a green sub-pixel and a blue sub-pixel, wherein the blue sub-pixel includes at least a first blue sub-sub-pixel, a second blue sub-sub-pixel, and a third blue sub-sub-pixel;
wherein the red sub-pixel, the green sub-pixel, the first blue sub-sub-pixel, the second blue sub-sub-pixel, and the third sub-sub-pixel are arranged adjacent to each other in a block configuration;
wherein during a first timing, a first combination of blue sub-sub-pixels consisting of the first and second blue sub-sub-pixels are driven together;
wherein during a second timing, a second combination of blue sub-sub-pixels consisting of the second and the third blue sub-sub-pixels are driven together;
wherein during a third timing, a third combination of blue sub-sub-pixels consisting of the first and third blue sub-sub-pixels are driven together;
wherein in operation, the first timing, the second timing, and the third timing are driven in sequence.

2. The EL display panel of claim 1, wherein the red sub-pixel, the green sub-pixel, the first blue sub-sub-pixel, and the second blue sub-sub-pixel are arranged in this order side by side in a stripe form.

3. The EL display panel of claim 1, wherein area of the red sub-pixel, area of the green sub-pixel, and area of the first blue sub-sub-pixel are in the ratio of about 100:110:120, and area of the red sub-pixel, area of the green sub-pixel, and area of the second blue sub-sub-pixel are in the ratio of about 100:110:120.

4. The EL display panel of claim 1, wherein areas of the first, second, and third blue sub-sub-pixels are equal to each other.

5. The EL display panel of claim 1, wherein area of the red sub-pixel, area of the green sub-pixel and a sum of areas of any two of the first, second and third blue sub-sub-pixels are in a ratio of about 100:110:120.

6. A method of driving an electroluminescence (EL) display panel comprising a plurality of pixels arranged in a matrix, each of the pixels including a red sub-pixel, a green sub-pixel and a blue sub-pixel, and the blue sub-pixel including at least a first blue sub-sub-pixel, a second blue sub-sub-pixel, and a third blue sub-sub-pixel, and the red sub-pixel, the green sub-pixel, the first blue sub-sub-pixel, the second blue sub-sub-pixel, and the third blue sub-sub-pixel being arranged adjacent to each other in a block configuration, the method comprising:
driving, during a first timing, a first combination of blue sub-sub-pixels consisting of the first and second blue sub-sub-pixels being driven together;
driving, during a second timing, a second combination of blue sub-sub-pixels consisting of the second and the third blue sub-sub-pixels being driven together;
driving, during a third timing, a third combination of blue sub-sub-pixels consisting of the first and third blue sub-sub-pixels being driven together;
wherein in operation, the first timing, the second timing, and the third timing are driven in sequence.

* * * * *